United States Patent [19]
Pasternack et al.

[11] 3,956,235
[45] May 11, 1976

[54] PHOTOPOLYMERIZABLE COMPOUNDS STABILIZED AGAINST PREMATURE GELATION WITH COPPER COMPOUNDS AND THIOCARBAMATES

[75] Inventors: George Pasternack, Chicago; Thor P. Jondahl, Oak Park, both of Ill.

[73] Assignee: Continental Can Company, Inc., New York, N.Y.

[22] Filed: Jan. 6, 1975

[21] Appl. No.: 539,199

Related U.S. Application Data

[63] Continuation-in-part of Ser. No. 482,294, June 24, 1974, abandoned, which is a continuation-in-part of Ser. No. 452,227, March 18, 1974, abandoned.

[52] U.S. Cl. ............ 260/45.75 C; 260/42.21; 260/45.7 S; 260/45.75 N; 260/45.75 W; 260/45.9 NC
[51] Int. Cl.² ............................................. C08K 5/39
[58] Field of Search ........... 260/45.75 R, 45.75 N, 260/45.75 C, 45.75 W, 45.75 V, 45.75 B, 45.9 R, 45.8 N, 42.21

[56] References Cited
UNITED STATES PATENTS

| | | | |
|---|---|---|---|
| 2,993,789 | 7/1961 | Crawford | 260/45.9 X |
| 3,218,275 | 11/1965 | Geigle | 260/45.75 W X |
| 3,450,613 | 6/1969 | Steinberg | 204/159.15 |
| 3,483,239 | 12/1969 | Hurlock et al. | 260/45.75 N X |

Primary Examiner—Lewis T. Jacobs
Attorney, Agent, or Firm—Paul Shapiro; Joseph E. Kerwin; William A. Dittmann

[57] ABSTRACT

Photopolymerizable ethylenically unsaturated ester compositions useful as coating and printing ink vehicles, and especially pigmented coatings and inks, are stabilized to premature gelation by incorporating therein a small but effective amount of a stabilizing combination of a copper containing compound and a thiocarbamate compound.

28 Claims, No Drawings

PHOTOPOLYMERIZABLE COMPOUNDS STABILIZED AGAINST PREMATURE GELATION WITH COPPER COMPOUNDS AND THIOCARBAMATES

This application is a continuation-in-part of copending application Ser. No. 482,294 filed June 24, 1974 which in turn is a continuation-in-part of copending application Ser. No. 452,227 filed Mar. 18, 1974, both now abandoned.

BACKGROUND OF THE INVENTION

1. Field of the Invention

This invention relates to photopolymerizable compositions which are useful as coating and printing ink vehicles and more particularly to pigmented photopolymerizable coatings and inks which are stable to premature gelation.

2. The Prior Art

Printing inks and coatings prepared using photopolymerizable vehicles are known to the art which can be polymerized and dried by exposure to ultraviolet radiation as example, U.S. Pat. No. 2,453,769, 2,453,770, 3,013,895, 3,051,591, 3,326,710, 3,511,710, 3,772,062 and 3,804,735.

These photopolymerizable inks and coatings are generally pigmented ethylenically unsaturated polyester compositions. When photoinitiators are incorporated in the composition, thin liquid films of the photopolymerizable composition can be cured to a hard film within 1 second or less using medium pressure mercury lamps.

The use of photopolymerizable inks and coatings eliminates the use of volatile organic solvents and the high cost and time of oven-baking which has heretofore been the conventional practice for drying and hardening inks and coatings.

In formulating inks using photopolymerizable unsaturated polyester vehicles, it was found that for some unexplainable reason, when the ester vehicles, which are normally stable to gelation at room temperature were pigmented with colorants, the ester vehicle self-polymerized within a short time to form undesirable gels. The formation of gels in the ink or coating formulation substantially destroys the commercial utility of the formulation. Preventing the gelation of the pigmented formulation or at least extending the time in which a pigmented composition will gel is important in commercial practice as several weeks storage is often required between formulation of the ink or pigmented coating and actual use of the formulation in printing and coating applications.

SUMMARY OF THE INVENTION

In accordance with the present invention there is provided photopolymerizable compositions which exhibit improved stability to gel formation and which may be rapidly polymerized and hardened by exposure to a source of ultraviolet radiation, the compositions being comprised of an ethylenically unsaturated ester and a small but effective amount of a stabilizing combination of a copper containing compound and a thiocarbamate compound having the formula:

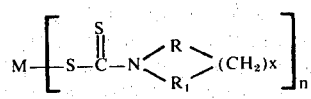

wherein M is

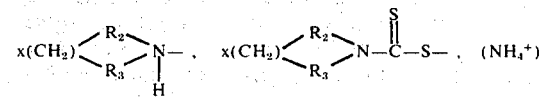

or a metal cation having a valence of 1 to 3 and each of R, R₁, R₂, and R₃ (same or different) are hydrogen, aryl, saturated and unsaturated alkyl groups having 1 to 20 carbon atoms, aralkyl or alkaryl groups having 7 to 15 carbon atoms and amino, sulfo- and oxy-substituted alkyl and aryl groups, n is an integer of 1 to 3 and x is an integer from 0 to 1. Thus, the alkyl groups represented by R, R₁, R₂ and R₃ may be straight chain aliphatic groups, branched chained aliphatic groups and cyclic aliphatic groups or form heterocyclic ring structures with the nitrogen atom present in the thiocarbamate compound.

When the combination of a copper containing compound and a thiocarbamate compound of the type disclosed is incorporated in ethylenically unsaturated esters an especially pigmented esters, in accordance with the practice of the present invention, the period of time during which the photopolymerizable ester will withstand gel formation is extended to commercially acceptable levels. As will hereinafter be illustrated, when either member of the stabilizing combination is omitted from the photopolymerizable composition, no appreciable diminution in gel time is obtained.

PREFERRED EMBODIMENTS

The term "ethylenically unsaturated ester compound" as used herein means, monohydric alcohol esters of α, β-ethylenically unsaturated acids, polyesters obtained by the reaction of an α,β-ethylenically unsaturated mono- or dibasic acid with a polyhydric alcohol having 2 to 6 hydroxyl groups or a polyepoxide containing at least 2 reactive epoxy groups in the polyepoxide molecule and mixtures thereof.

Included within the meaning of α,β-ethylenically unsaturated acid are unsaturated monocarboxylic acids having from 3 to 6 carbon atoms, e.g. acrylic acid, methacrylic acid, crotonic acid and sorbic acid and unsaturated dicarboxylic acids having 4 to 10 carbon atoms, e.g. maleic acid, tetrahydrophthalic acid, fumaric acid, glutaconic acid, itaconic acid and the like.

Illustrative of photopolymerizable ethylenically unsaturated polyesters useful in the practice of the present invention are acrylic acid and methacrylic acid esters of aliphatic polyhydric alcohols such as, for example, the di- and polyacrylates and the di-and polymethacrylates of ethylene glycol, polyalkylene glycols such as diethylene glycol, triethylene glycol, tetraethylene glycol, tetramethylene glycol, the corresponding ether glycols, triethylolethane, trimethylolpropane, pentaerythritol, dipentaerythritol and polypentaerythritols.

Typical unsaturated polyesters include, but are not limited to, trimethylolpropane triacrylate, trimethylolethane triacrylate, triethylolpropane trimethacrylate, trimethylolethane trimethaacrylate, tetramethylene glycol dimethacrylate, ethylene glycol dimethacrylate, triethylene glycol dimethacrylate, tetraethylene glycol diacrylate, tetraethylene glycol dimethacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, pentaerythritol dimethacrylate, pentaerythritol trimethacrylate, and dipentaerythritol dimethacrylate.

A preferred class of ethylenically unsaturated polyester compounds useful in the practice of the present invention are the reaction products of a polyepoxide having at least two reactive groups in the polyepoxide molecule and an ethylenically unsaturated acid such as the $\alpha,\beta$-ethylenically unsaturated monocarboxylic acids having 3 to 6 carbon atoms and $\alpha,\beta$-ethylenically unsaturated dibasic acids having 4 to 10 carbon atoms previously discussed. These polyepoxide derived polyesters are well known to the art, e.g. U.S. Pat. Nos. 3,637,618, 3,408,422, 3,373,075, and British patent No. 1,241,851; the teachings of which are incorporated herein by reference.

Typical examples of polyepoxide compounds useful in the preparation of ethylenically unsaturated polyesters preferred in the practice of the present invention include epoxidized polybutadiene (Oxiron 2001), epoxidized linseed oil (Epoxol 9-5), 1,4-butylene diglycydyl ether (RD-2), vinylcyclohexene diepoxide (Epoxide 206) resorcinol diglycidyl ether (Kopoxite 159), Bisphenol A diglycidyl ether (DER-332), s-tetraphenylethane tetra-glycidyl ether (Epon 1031), novalac resin polyglycidyl ether (DEN 438), dicyclopentadiene diepoxide (Epoxide 207) and dipentene dioxide.

Polyesters especially preferred in the practice of the present invention are polyesters prepared by reacting Bisphenol A diglycidyl ether, i.e. the diglycidyl ether of 2,2-bis (4-hydroxyphenyl propane) with an ethylenically unsaturated monocarboxylic acid such as acrylic or methacrylic acid at a molar ratio of about 1:2 to prepare the diacrylate reaction product or with an ethylenically unsaturated dicarboxylic acid such as itaconic acid at equal molar ratios.

The Bisphenol A diglycidyl ether diacrylate may be blended with the Bisphenol A diglycidyl ether itaconate as well as other ethylenically unsaturated compounds and especially acrylate ester compounds to prepare photopolymerizable mixtures having the physical properties suitable for printing inks and coatings.

Examples of thiocarbamate compounds useful in the practice of the present invention include, tetramethylthiuram disulfide, tetraethylthiuram disulfide, tetrapropylthiuram disulfide, tetrabutylthiuram disulfide, tetradecylthiruam disulfide, tetrahexadecylthiuram disulfide, tetracicosylthiuram disulfide, 1-methyl-1-propyl-6-butyl-6-methyl thiuram disulfide, 1-propyl-1-butyl-6-methyl-6-t-butyl thiuram disulfide, dihexamethylene thiuram disulfide, dipentamethylene thiuram disulfide, piperdinium pentamethylene dithiocarbamate, piperdinium dibutyl dithiocarbamate, piperdinium dicyclohexyl dithiocarbamate, piperdinium di(3-oxycyclohexyl) dithiocarbamate, metal thiocarbamates as for example, nickel dipropyldithiocarbamate, nickel dibutyldithiocarbamate, nickel didecyldithiocarbamate, zinc dimethyldithiocarbamate, zinc dibutyldithiocarbamate, zinc dihexyldithiocarbamate, sodium dibutyl dithiocarbamate, copper dimethyl dithiocarbamate, copper dibutyldithiocarbamate, copper diethyldithiocarbamate, copper diamyldithiocarbamate, copper dioctadecyldithiocarbamate, copper diphenyldithiocarbamate, copper dibenzyldithiocarbamate, copper di(orthotolylaminoethyl) dithiocarbamate, copper dicyclohexyldithiocarbamate, ammonium dipropyldithiocarbamate, potassium dihexyldithiocarbamate, calcium dihexyldithiocarbamate, zirconium diethyldithiocarbamate, cobalt dibutyldithiocarbamate, antimony dibutyldithiocarbamate, bismuth dimethyldithiocarbamate, lead dimethyldithiocarbamate, tin dibutyldithiocarbamate, copper dicyclopentyldithiocarbamate, copper 1-butyl-1-cyclohexyl-7-butyl-7-cyclohexyl dithiocarbamate, copper di(3-oxacyclohexyl) dithiocarbamate, copper di(4-oxacyclohexyl) dithiocarbamate, copper di(3-thiocyclohexyl) dithiocarbamate, copper di(4-azacyclohexyl) dithiocarbamate, copper 1-butyl-1-(3-oxacyclohexyl)-7-butyl-7-(3-oxacyclohexyl) dithiocarbamate, copper di(4-pyridyl) dithiocarbamate, copper di (4-n,n-dimethyl anilino) dithiocarbamate, copper di(4-anisyl) dithiocarbamate, copper di(4-thioanisyl) dithiocarbamate, and copper di(3-furanyl) dithiocarbamate.

The thiocarbamate compounds may be incorporated in the photopolymerizable ester compositions at concentrations ranging from 0.10 to about 1.0% by weight. Higher concentrations may be used if necessary, but concentrations substantially in excess of 1.0% by weight have been found to have a significant retarding effect on the speed at which the photopolymerizable composition will be cured by ultraviolet radiation.

Copper containing compounds useful in the practice of the present invention include any copper containing compound which is compatible with the photopolymerizable ester composition.

Illustrative examples of copper containing compounds useful in the practice of the present invention include the inorganic acid cupric salts such as cupric chloride, cupric nitrate, cupric phosphate, cupric sulfate, cupric chromate, organic acid cupric salts as for example cupric napthenate, salts having the formula $Cu(OOCR)_2$ wherein R is a saturated or unsaturated straight or branched chain aliphatic substituent having about 2 to 20 carbon atoms such as cupric acetate, cupric propionate, cupric butyrate, cupric hexoate, cupric octoate, cupric laurate, cupric palmitate, cupric stearate, and cupric oleate.

Cuprous compounds such as inorganic acid cuprous salts and organic acid cuprous salts such as cuprous chloride, cuprous acetate and the like are also included within the meaning of copper containing compounds and are useful in the practice of the present invention.

In the event that photopolymerizable compositions are pigmented with copper containing pigments such as copper phthalocyanine, the separate inclusion of a copper compound in the photopolymerizable composition is not generally required. As will hereinafter be illustrated, photopolymerizable compositions pigmented with copper containing pigments are stabilized to gel formation merely by the addition thereto of a non-copper containing thiocarbamate compound. However, if these same non-copper thiocarbamate compounds are incorporated in a photopolymerizable composition in which copper ion is absent, effective gel stabilization generally does not occur. When the photopolymerizable composition is pigmented with a colorant that does not contain copper cation, the stabilizing combination is most conveniently incorporated in the photopolymerizable composition by the singular addition of a copper salt of a thiocarbamate compound as for example copper dibutyldithiocarbamate.

The copper cation is desirably present in the photopolymerizable composition in an amount about stoichiometrically equal to the amount of thiocarbamate compound incorporated in the photopolymerizable composition. For example, when cupric compounds are incorporated in the photopolymerizable composition, the molar ratio of $Cu^{++}$ ion to thiocarbamate radical is generally about 1:2. When cuprous compounds are incorporated in the photopolymerizable composition the molar ratio of $Cu^+$ ion to thiocarbamate radical is generally about 1:1. It has been determined that the molar ratio of $Cu^{++}$ ion to thiocarbamate radical may vary from 1:2, if the ratio is appreciably greater than 1:2, as for example, 1:1, an appreciable diminution in stabilizing effectiveness is encountered. Generally a molar ratio of $Cu^{++}$ ion to thiocarbamate radical of about 0.8:2 to 1.5:2 will give beneficial results, and a molar ratio of about 1:2 to 1.2:2 is preferred. The molar ratio of $Cu^+$ ion to thiocarbamate radical may vary from about 0.8:1 to 1.2:1.

When copper containing pigments are used as a source of the copper cation for the stabilizing combination, the pigments although they may be incorporated in photopolymerizable ester compositions at relatively high concentrations, e.g. 5 to 25% by weight of the ester composition, are substantially insoluble in the ester composition and do not furnish an excessive amount of copper ion to the ester composition. It has been found in practice that by dispersing copper containing pigments in ethylenically unsaturated photopolymerizable ester compositions, a sufficient amount of copper ion is made available to the composition by the pigment to form an effective stabilizer combination when used cojointly with 0.1 to 1.0% by weight of a non-copper containing thiocarbamate compound.

Illustrative examples of materials useful as pigments for photopolymerizable ester based printing inks include copper phthalocyanine blue (Pigment Blue 15), copper polychlorophthalocyanine green, copper bromochlorophthalocyanine, carbon black, Chrome Yellow No. 40-4500 (American Cyanamid), Naphthanil Red Dark No. RT-539-D (Du Pont), Valencia Moly Orange No. YE-421-D (Du Pont), Watchung Rubine No. RT-709-D (Du Pont), Sahara Yellow No. X-2864 (Hercules), Bon Maroon Light No. RT-533-D (Du Pont), Phthalocyanine Blue No. 55-3295 (American Cyanamid), Duplex Barium Lithol No. 20-4480 (American Cyanamide), Paliofast Blue (non-metallic) No. 7560 (BASF), Rhodamine B No. 20-7470 (American Cyanamid), Monastral Red B No. RT-790-D (Du Pont) and Supercarbovar No. SRS-652 (Cabot).

Photoinitiators may be incorporated in the ester compositions used as vehicles for photopolymerizable printing inks and coatings to accelerate the speed at which the inks and coatings harden on exposure to ultraviolet light. Illustrative examples of suitable photoinitiators include benzophenone, Michler's ketone (4,4'-bisdimethylamino benzophenone) and mixtures thereof. The photoinitiators are incorporated in the photopolymerizable compositions at a concentration of 0.1 to 5% by weight.

In general, printing inks prepared using the pigmented photopolymerizable compositions of the present invention are prepared in the same manner as conventional printing inks. Generally, the printing inks contain about 30 to about 95 percent by weight of the photopolymerizable composition and about 5 to about 70 percent by weight of the pigment.

In printing metal surfaces with ultraviolet curable printing inks, the ink is applied using a printing press conventionally used for printing on metal substrates. Once the metal substrate, generally in the form of a sheet is printed, the substrate is positioned to pass under a source of ultraviolet light to dry and harden the ink. In most instances, the ultraviolet light source is maintained at about 0.5 to about 5 inches from the printed substrate undergoing irradiation.

Rapid drying of the inks using the stabilized photoinitiated compositions of the present invention is effected within a second of exposure to ultraviolet light emitted from an artificial source having a wave length in the range between 4000A and 1800A.

In the printing of metal coil stock for beverage container manufacture where extremely high speed drying of the ink (i.e. within one second) is required, mercury vapor discharge lamps, especially of the medium pressure type are used as a source of ultraviolet radiation. The output of commercially available medium pressure mercury vapor lamps varies between 100 to 200 watts per linear inch of lamp surface.

The present invention is illustrated by the Examples which follow:

EXAMPLE I

A photopolymerizable printing ink vehicle was prepared and consisted of 54.0 parts of the diacrylate reaction product of Bisphenol A diglycidyl ether and acrylic acid, 39.0 parts pentaerythritol tetracrylate, 2.6 parts of an unsaturated polyester prepared by reacting equal molar amounts of itaconic acid and Bisphenol A diglycidyl ether, 3.0 parts of tetraethylene glycol diacrylate, 0.8 parts Michler's ketone and 0.6 parts benzophenone.

To determine the stability of the ink vehicle to gel formation when metal phthalocyanine pigments were incorporated therein the following test procedure was utilized:

Into a two ounce glass jar was placed 17.43 grams of the photopolymerizable ink vehicle just described as well as 2.4 grams of a metal phthalocyanine pigment and 0.25–1.0% by weight based on the ink vehicle of a thiocarbamate compound dissolved in 1.5 grams methyl ethyl ketone. The mixture was then stirred using a high speed air motor (60 psi) until the pigment was uniformly distributed in the ink vehicle. The pigmented sample was placed in an oven heated to 325°F and monitored every 20 minutes for the appearance of gel material in the jar. By this test unpigmented vehicle gels in 80 minutes.

A series of storage stability tests were run using varying concentrations of different thiocarbamate compounds. The results of these accelerated gel stability tests are recorded in Tables I and II below.

In Table I, the pigment incorporated in the vehicle was copper phthalocyanine blue pigment. In Table II, copper polychlorophthalocyanine green pigment designated "CPG" and nickel phthalocyanine blue designated "NPB", were used as the pigments. The appearance of a gel in the test jars is designated by the term "Gel".

For purposes of comparison, in a separate series of tests run in accordance with the procedure of Example 1, a number of known stabilizer compounds as well as compounds closely related to the compounds used in the present invention, but outside the scope of the invention, were incorporated in the pigmented ink vehicle and these comparison ink compositions were also tested for gel stability. The results of these comparative tests, designated by the symbol "C", are also summarized in Tables I and II. Also tests in which no stabilizer compounds were incorporated in the pigmented ink vehicle were also run and are also designated by the symbol "C" in the Tables.

After application of the stabilized pigmented photopolymerizable composition, the coated plate was placed under a medium pressure mercury lamp at a distance of about 1.0 inch from the lamp surface.

The radiation emitted by the lamp was approximately 200 watts/in. of lamp surface. The coated plate when exposed to the ultraviolet radiation dried in 0.6 seconds.

TABLE I

| Test No. | Stabilizer | Concentration Wt. % | Gellation Time (Minutes) | | | | |
|---|---|---|---|---|---|---|---|
| | | | 40 | 80 | 100 | 120 | 160 |
| 1 | Zinc dibutyldithiocarbamate | 0.25 | | | | Gel | |
| 2 | Zinc dibutyldithiocarbamate | 1.0 | | | | | |
| 3 | Nickel dibutyldithiocarbamate | 0.5 | | Gel | | | |
| 4 | Nickel dibutyldithiocarbamate | 1.0 | | | Gel | | |
| 5 | Tetraethylthiuram disulfide | 0.25 | | Gel | | | |
| 6 | Tetraethylthiuram disulfide | 1.0 | | | Gel | | |
| 7 | Sodium N,N-diethyldithiocarbamate | 1.0 | | | | Gel | |
| 8 | Piperidinium pentamethylene dithiocarbamate | 1.0 | | Gel | | | |
| 9 | 1-Pyrrolidenecarbodithioc acid ammonium salt | 0.25 | | Gel | | | |
| 10 | 1-Pyrrolidenecarbodithioc acid ammonium salt | 1.0 | | Gel | | | |
| $C_1$ | None | 0 | Gel | | | | |
| $C_2$ | p-Methoxyphenol | 1.0 | Gel | | | | |
| $C_3$ | p-Methoxyphenol | 2.0 | Gel | | | | |
| $C_4$ | 2,6-di-tert.-butyl-4-methylphenol | 1.0 | Gel | | | | |
| $C_5$ | 2,6-di-tert.-butyl-4-methylphenol | 2.0 | Gel | | | | |
| $C_6$ | 1,1,3,3-tetraethyl-2-thiourea | 1.0 | Gel | | | | |
| $C_7$ | N,N-Dimethylthioformamide | 1.0 | Gel | | | | |
| $C_8$ | Zinc isopropyl xanthate | 1.0 | Gel | | | | |

TABLE II

| Test No. | Stabilizer | Concentration Wt. % | Pigment | Gellation Time (Minutes) | | |
|---|---|---|---|---|---|---|
| | | | | 20 | 40 | 60 |
| 11 | Zinc dibutyl dithiocarbamate | 1.0 | CPG | | | Gel |
| $C_9$ | 2,6-di-t-butyl-4-methylphenol | 1.0 | CPG | | Gel | |
| $C_{10}$ | 2,6-di-t-butyl-4-methylphenol | 2.0 | CPG | Gel | | |
| $C_{11}$ | None | 0 | CPG | | Gel | |
| $C_{12}$ | Zinc dibutyldithiocarbamate | 0.25 | NPB | | | Gel |
| $C_{13}$ | Nickel dibutyldithiocarbamate | 0.25 | NPB | | Gel | |
| $C_{14}$ | None | 0 | NPB | Gel | | |

The data in Tables I and II indicate that copper phthalocyanine pigmented photopolymerizable compositions stabilized with a thiocarbamate compound in accordance with the practice of the present invention exhibit superior storage stability when compared to copper phthalocyanine pigmented photopolymerizable compositions stabilized with compounds outside the scope of the invention as well as photopolymerizable compositions pigmented with non-copper containing pigments and thiocarbamate compounds.

EXAMPLE II

A zinc dibutyldithiocarbamate stabilized, copper phthalocyanine blue pigmented photopolymerizable composition composed of the composition used in Test number 1 of Table 1 was applied to steel plate of the type used in the manufacture of steel beverage containers using a number 10 draw bar which evenly distributed the composition as a thin film on the plate.

EXAMPLE III

A series of accelerated ink vehicle storage stability tests were conducted following the procedure of Examaple I with the exception that 17.565 grams of ink vehicle were used, having incorporated therein 12 percent by weight, based in the weight of the vehicle, of a variety of different pigments which did not contain copper ion and 0.20 and 0.50 percent by weight of copper dibutyldithiocarbamate (CDBDTC). The results of these accelerated storage stability tests are recorded in Table III below.

For purposes of comparison, in a separate series of accelerated storage stability test, 0.25% zinc dibutyldithiocarbamate (ZDBDTC) and 0.50% by weight copper naphthenate (CNAP) were separately incorporated in the differently pigmented vehicles. The results of these comparative accelerated storage stability tests are also recorded in Table III below.

TABLE III

| Pigment Incorporated In Vehicle | Pigmented Vehicle + CDBDTC 0.2% | 0.5% | Pigmented Vehicle + ZDBDTC 0.25% | Pigmented Vehicle + CNAP 0.50% | Pigmented Vehicle No Stabilizer Added |
|---|---|---|---|---|---|
| None | 150* | 220 | 60 | 20 | 80 |
| Duplex Barium Lithol | 120 | 370 | 40 | 30 | 40 |
| Rhodamine B | 180 | 270 | 20 | 20 | 40 |
| Naphthanil Red Dark | 160 | 310 | 40 | 20 | 40 |
| Watchung Red | 160 | 410 | 40 | 10 | 40 |
| Bon Maroon Light | 120 | 270 | 80 | 20 | 40 |
| Sahara Yellow | 210 | 390 | 60 | 10 | 60 |
| Paliofast Blue | 120 | 290 | 60 | 20 | 80 |
| Monastral Red B | 180 | 430 | 60 | 20 | 60 |
| Chrome Yellow | 120 | 200 | 20 | 10 | 20 |
| Moly Orange | 210 | 430 | 20 | 10 | 40 |
| Moly Orange | — | — | 20** | — | — |
| Moly Orange | — | — | 20*** | — | — |

*0.05% by weight CDBDTC used.
**1% by weight ferric dibutyldithiocarbamate substituted for 0.25% by weight ZDBDTC.
***1% by weight silver dibutyldithiocarbamate substituted for 0.25% by weight ZDBDTC.

The data in Table III indicates that photopolymerizable compositions pigmented with pigments which do not contain copper must have a combination of a copper containing compound and a thiocarbamate compound incorporated therein to stabilize the pigmented composition to gel formation.

EXAMPLE IV

A series of accelerated ink vehicle storage stability tests were conducted following the procedure of Example III using unpigmented vehicle and moly orange pigmented vehicle. Zinc dibutyldithiocarbamate at a concentration of 0.25% by weight (equal to $3.16 \times 10^{-4}$ moles dibutyldithiocarbamate) and varying amounts of $CuCl_2$ were incorporated in the vehicles. The results of these accelerated storage stability tests are recorded in Table IV below.

TABLE IV

| Test No. | Concentration $CuCl_2$ (Wt. %) | Moles $Cu^{++}$ ×10⁻⁴ | GELLATION TIME (minutes) Unpigmented Vehicle | Pigmented Vehicle |
|---|---|---|---|---|
| 1 | 0 | 0 | 80 | 60 |
| 2 | 0.05 | 0.88 | 160 | 160 |
| 3 | 0.10 | 1.75 | 180 | 160 |
| 4 | 0.20 | 3.52 | 60 | 40 |
| 5 | 0.30 | 5.28 | 20 | 40 |
| 6 | 0.40 | 7.04 | 20 | 40 |
| 7 | 0.50 | 8.80 | 20 | 40 |

The results of the accelerated ink vehicle storage stability tests recorded in Table IV indicate that combinations of dibutyldithiocarbamate compounds and copper containing compounds are effective stabilizer combinations for ethylenically unsaturated photopolymerizable compositions (Tests nos. 2-3). However when the molar amounts of $Cu^{++}$ and dibutyldithiocarbamate radical are substantially greater than 1:2, e.g. 1:1 or greater as in Tests numbers 4-7, the stabilizing effect of the combination is substantially reduced to an ineffective state.

EXAMPLE V

In a series of accelerated ink vehicle storage stability tests the procedure of Example III was repeated with the exception that a variety of different pigments were incorporated in the vehicle along with a stabilizing combination of 0.25% by weight zinc dibutyldithiocarbamate (ZDBDTC) and 0.5% by weight copper naphthenate (CNAP). The results of these accelerated gel stability tests are recorded in Table V below.

For purposes of comparison, in a separate series of accelerated storage stability tests 0.25% by weight ZDBDTC and 0.50% by weight CNAP were separately incorporated in the different pigmented vehicles. The results of these comparative accelerated gel stability tests are also recorded in Table V below.

TABLE V

| Pigment | Vehicle + ZDBDTC + CNAP | Vehicle + ZDBDTC | Vehicle + CNAP | Vehicle |
|---|---|---|---|---|
| None | 220 | 60 | 20 | 80 |
| DuPlex Barium Lithol | 140 | 40 | 20 | 40 |
| Rhodamine B | 160 | 20 | 20 | 40 |
| Naphanil Red Dark | 240 | 40 | 40 | 40 |
| Watching Rubine | 240 | 40 | 20 | 40 |
| Bon Maroon Light | 140 | 80 | 40 | 40 |
| Monastral Red B | 240 | 60 | 20 | 60 |
| Chrome Yellow | 80 | 20 | 20 | 40 |
| Moly Orange | 80 | 20 | 20 | 40 |
| Sahara Yellow | 240 | 60 | 20 | 60 |
| Cyano Blue (contains Cu) | 120 | 120 | 20 | 20 |
| Cyano Blue | 220 | 60 | 20 | 80 |

EXAMPLE VI

In a series of accelerated ink vehicle storage stability tests the procedure of Example III was repeated using unpigmented vehicle and moly orange pigmented vehicle. A stabilizing combination of 0.25% by weight zinc dibutyldithiocarbamate (ZDBDTC) and 0.05% by weight CuCl was separately incorporated in the vehicles. The results of these accelerated gel stability tests are recorded in Table VI below.

For purposes of comparison, in a separate series of accelerated storage stability tests, 0.05% by weight CuCl has separately incorporated in the vehicles. The results of these comparative accelerated gel stability tests are also recorded in Table VI below.

TABLE VI

| Pigment | TIME FOR GELLATION (Minutes) | | |
|---|---|---|---|
| | Vehicle + ZDBDTC + CuCl | Vehicle + CuCl | Vehicle |
| None | 200 | 60 | 60 |
| Moly Orange | 140 | 20 | — |

What is claimed is:

1. A photopolymerizable composition comprised of an ethylenically unsaturated ester and an amount of a copper containing compound and a thiocarbamate compound sufficient to stabilize the photopolymerizable composition to gel formation, the thiocarbamate composition having the formula

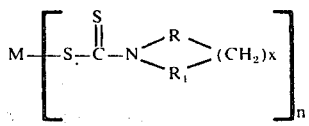

wherein M is selected from the group consisting of

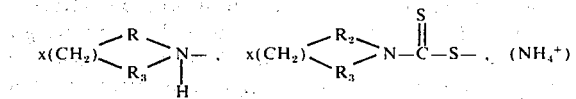

and a metal cation having a valence of 1 to 3 and each of R, $R_1$, $R_2$ and $R_3$ are selected from the group consisting of hydrogen, aryl, alkyl groups having 1 to 20 carbon atoms, aralkyl and alkaryl groups having 7 to 15 carbon atoms and amino-, sulfo- and oxy-substituted alkyl and aryl groups, $n$ is an integer of 1 to 3 and $x$ is an integer of 0 to 1.

2. The composition of claim 1 wherein the photopolymerizable composition contains a pigment.

3. The composition of claim 1 wherein the copper containing compound is a pigment containing copper.

4. The composition of claim 1 wherein the copper containing compound is the copper salt of an organic or inorganic acid.

5. The composition of claim 4 wherein the copper salt is $CuCl_2$.

6. The composition of claim 4 wherein the copper salt is CuCl.

7. The composition of claim 4 wherein the copper salt is copper napthenate.

8. The composition of claim 2 wherein the photopolymerizable composition contains about 5 to 70 percent by weight of the pigment.

9. The composition of claim 1 wherein the copper containing compound incorporated in the photopolymerizable composition contains copper cation in an amount about stoichiometrically equal to the thiocarbamate compound incorporated in the photopolymerizable composition.

10. The composition of claim 1 wherein the copper compound present in the photopolymerizable composition contains copper ion in the $Cu^{++}$ valence state and the molar ratio of $Cu^{++}$ to thiocarbamate radical present in the photopolymerizable composition varies from about 0.8:2 to 1.5:2.

11. The composition of claim 1 wherein the thiocarbamate compound is incorporated in the photopolymerizable composition at a concentration at about 0.10 to about 1.0 percent by weight.

12. The composition of claim 1 wherein the thiocarbamate compound is a metal dialkyldithiocarbamate.

13. The composition of claim 12 wherein the metal dialkyldithiocarbamate compound is zinc dibutyldithiocarbamate.

14. The composition of claim 12 wherein the metal dialkyldithiocarbamate compound is nickel dibutyldithiocarbamate.

15. The composition of claim 12 wherein the metal dialkyldithiocarbamate compound is sodium N,N-diethyldithiocarbamate.

16. The composition of claim 1 wherein the thiocarbamate compound is piperidinium pentamethylene dithiocarbamate.

17. The composition of claim 1 wherein the thiocarbamate is 1-pyrrolidenecarbodithioc acid ammonium salt.

18. The composition of claim 1 wherein the thiocarbamate compound is tetraethylethiuram disulfide.

19. The composition of claim 1 wherein the copper containing compound and the thiocarbamate compound are both a copper dialkyldithiocarbamate.

20. The composition of claim 19 wherein the copper dialkyldithiocarbamate is copper dibutyldithiocarbamate.

21. The composition of claim 1 wherein the ethylenically unsaturated ester is the reaction product of a polyepoxide having at least two reactive groups in the polyepoxide molecule and an acid selected from the group consisting of $\alpha,\beta$-ethylenically unsaturated mono carboxylic acids having 3 to 6 carbon atoms and $\alpha,\beta$-ethylenically unsaturated dibasic acids having 4 to 10 carbon atoms.

22. The composition of claim 1 wherein the unsaturated compound is the reaction product of a polyhydric alcohol having 2 to 6 carbon atoms and an acid selected from the group consisting of $\alpha,\beta$-ethylenically unsaturated monocarboxylic acids having 3 to 6 carbon atoms and $\alpha,\beta$-ethylenically unsaturated dibasic acids having 4 to 10 carbon atoms.

23. The composition of claim 21 wherein the polyepoxide is the diglycidyl ether of bisphenol A.

24. The composition of claim 21 wherein the acid is acrylic acid.

25. The composition of claim 21 wherein the acid is itaconic acid.

26. The composition of claim 22 wherein the alcohol is pentaerythritol.

27. The composition of claim 22 wherein the alcohol is polyethylene glycol.

28. The composition of claim 1 wherein the copper compound present in the photopolymerizable composition contains copper ion in the $Cu^+$ valence state and the molar ratio of $Cu^+$ to thiocarbamate radical present in the photopolymerizable composition vaires from about 0.8:1 to 1.2:1.

* * * * *